US007756691B2

(12) United States Patent
Carey et al.

(10) Patent No.: US 7,756,691 B2
(45) Date of Patent: Jul. 13, 2010

(54) ESTABLISHING RELATIONSHIPS BETWEEN COMPONENTS IN SIMULATION SYSTEMS

(75) Inventors: Derek H. Carey, Fort Washington, MD (US); James R. Kozloski, New Fairfield, CT (US); Houda Lamehamedi, Troy, NY (US); Charles C. Peck, III, Newtown, CT (US); Ravishankar Rao, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 1107 days.

(21) Appl. No.: 10/448,724

(22) Filed: May 30, 2003

(65) Prior Publication Data

US 2004/0243369 A1 Dec. 2, 2004

(51) Int. Cl.
*G06G 7/48* (2006.01)
*G06F 15/177* (2006.01)
(52) U.S. Cl. .......................................... 703/6; 709/220
(58) Field of Classification Search .................. 709/220; 703/6
See application file for complete search history.

(56) References Cited

U.S. PATENT DOCUMENTS

| 5,872,973 A | * | 2/1999 | Mitchell et al. | ............. 719/332 |
| 6,341,312 B1 | | 1/2002 | French et al. | ............... 709/227 |
| 6,829,770 B1 | * | 12/2004 | Hinson et al. | ............... 719/318 |

* cited by examiner

*Primary Examiner*—Paul L Rodriguez
*Assistant Examiner*—Juan C Ochoa
(74) *Attorney, Agent, or Firm*—Ido Tuchman; E. Dwayne Nelson

(57) ABSTRACT

A system, method, and computer program product for configuring a network abstraction for simulation. Relationships between network models in the network abstraction are described in a network specification. A simulation infrastructure is adapted to configure the relationships between network models specified in the network specification. The simulation infrastructure is designed to acquire the network specification during run-time, access configuration, relationship parameterization, and execution APIs of model instances during run-time. Network models are designed to acquire access to modeling-specific APIs of other model instances during run-time in order to establish relationships specified in the network specification.

30 Claims, 6 Drawing Sheets

ESTABLISHING RELATIONSHIPS BETWEEN COMPONENTS IN SIMULATION SYSTEMS

FIELD OF THE INVENTION

The present invention relates generally to network simulators, and, more specifically, to an infrastructure that simplifies the configuration of network components for simulation.

BACKGROUND

A network is a collection of components connected to each other such that communication between the components can be carried out. A network, for example, can be a computer network containing thousands of computers coupled together to exchange digital information, or a telephone network with millions of telephones exchanging audio information. Networks may also be collections of entities or phenomena that have specific interactions, such as buyers and sellers in a market. Networks may also be organic, such as a brain with billions of neurons interconnected at synapses. Regardless of the type of network under consideration, it is often useful to abstract the network and simulate its behavior.

A network simulator is typically a computer abstraction of the network. A simulator can help design better networks, trouble shoot network problems, and discover how a network behaves. In general, simulators abstract networks as a collection of nodes interconnected by edges. This arrangement is often visualized as circles connected by lines, where the circles represent nodes and the lines representing edges.

Both nodes and edges are computational elements capable of having states associated with them. For instance, a node can have a voltage associated with it and an edge can have a weight associated with it. An edge connects a source node to a destination node, and may perform a transformation of the source node state variables before delivering them to the destination node. The destination node recalculates its new state based on all the inputs from edges that it receives. In the neural network simulation, for example, nodes model neurons and carry out computations, while edges model synapses and transmit the results from one node to other nodes. As mentioned, however, it is possible for the edges to perform computations as well. These synaptic computations may be simple, such as weighting of the connection strength between neurons, or more complex, such as varying the connection strength over time.

There are generally two conventional approaches to simulating networks. In a first approach, network models are "hard wired" in a special-purpose simulation program such that networks are simulated with very specific models for edges and nodes. Thus, the simulation infrastructure and models are generally designed and implemented with software code that is dependent on specific model implementations. Although such an approach provides fast simulation performance, flexibility is severely limited. Adding an additional component or a component application programming interface (API) often requires modifying the simulation infrastructure and possibly other component APIs or implementations. Thus, a simulation program using this first approach would likely need to be substantially rewritten if different nodes, edges, or topologies are desired.

In a second common approach, the simulation infrastructure and the components interact via compile-time APIs. The components, however, interact with each other through dynamically constructed and interpreted messages. Thus, a new component can be added without changing the component interaction, existing components, or component APIs. Adding a new mode of component interaction is accomplished by establishing a new message format. New message formats generally only affect the components that use them, which are most often new components. The cost of this flexibility, however, is run-time performance. Slower simulation performance is principally due to the dynamic construction and interpretation of the messages. Dynamic message construction and interpretation is typically an order of magnitude slower than interaction using compile-time interfaces.

Additionally, for some network simulation requirements, conventional simulation approaches may not suffice. Consider again the task of simulating a neural network. For certain abstractions the initial configuration of the network does not change during the simulation. Such a configuration is called a static configuration. Static configuration is useful in simulating a neural network over short time scales. During short time intervals the number of neurons may be considered constant and the relationships between them (the connections between axons and the dendrites or cell body) do not change.

For other simulations, however, the initial configuration may change over time. In this dynamic case, the variation may be due to the introduction or elimination of components or changes in the neurons over a longer time scale. Through the process of neurogenesis, new neurons may be introduced into the network. Conversely, existing neurons may die. Furthermore, new connections between neurons may be formed or eliminated. Changes to the configuration may be effected by the underlying simulation infrastructure or by the components themselves. In this latter case, there must be means for components to be dynamically created and to discover other components.

Moreover, in some models the effects of a relationship on model behavior may be parameterized. For such models, there must be a means for setting these parameters during the configuration process. These parameters are a property of the relationship, not of any of the components participating in the relationship. For example, consider again the neural network simulation. The effect of a connection on a post-synaptic neuron depends on where that connection is made. A connection onto the cell body will have a larger effect than one on the dendrite. The connection location is not a property of either participating neuron, since each neuron may participate in many such connections. Rather, it is a property of the connection itself.

SUMMARY OF THE INVENTION

The present invention addresses the above-mentioned limitations and other shortcomings of traditional simulation techniques by providing a means for establishing connections amongst various network model elements that allows different types of edges and nodes to connect to each other, allows network topology and elements to be changed, and allows dynamic creation of new elements and connections as the simulation progresses. The present invention beneficially provides a simulation architecture capable of decoupling the specification of network topology from the specifics of the elements that constitute the modeled network.

Thus, one aspect of the invention is a system for configuring a network abstraction for simulation. The system includes a run-time means to compute or acquire the desired configuration herein referred to as a network specification, such as a specification document adapted to describe relationships between network models in the network abstraction. A simulation infrastructure is adapted to instantiate and configure network models specified in the network specification. More specifically, the simulation infrastructure is designed to acquire the network specification during run-time, access configuration, relationship parameterization, and execution APIs of model instances during run-time. Models are designed to acquire access to modeling-specific APIs of model instances they interact with during run-time. The simulation infrastructure may initiate the interaction between models, but it is the models that establish the relationships through modeling-specific APIs to ensure compatibility.

Another aspect of the invention is a method for configuring a network abstraction for simulation. The method includes an accessing operation for reading the network specification. As mentioned, the network specification is adapted to describe relationships between network models in the network abstraction. An instantiating operation instantiates network models in accordance with the network specification. An establishing operation creates relationships between the network models in accordance with the network specification. An ensuring operation ensures that incompatible relationships are not established between the network models.

Yet another aspect of the invention is a computer program product adapted to configure a network abstraction for simulation. The computer program includes computer readable program codes to access a network specification, instantiate network models in accordance with the network specification, establish relationships between the network models in accordance with the network specification, and ensure that incompatible relationships are not established between the network models.

The foregoing and other features, utilities and advantages of the invention will be apparent from the following more particular description of various embodiments of the invention as illustrated in the accompanying drawings.

DETAILED DESCRIPTION OF THE INVENTION

Figure 1:
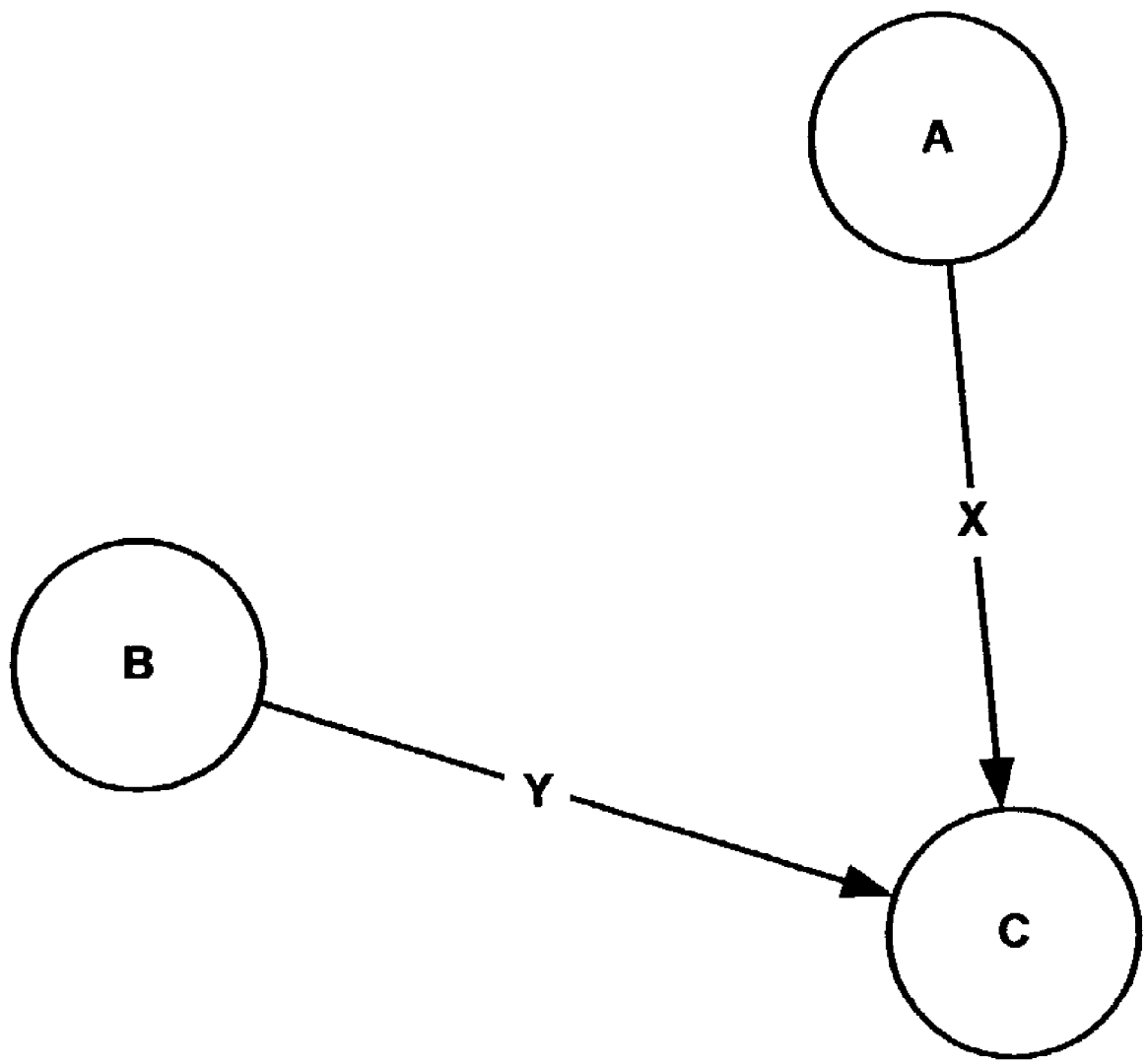
FIG. 1 shows an exemplary network graph expressed as nodes and edges.

The following description details how the invention is beneficially employed to improve the performance of network simulations. In FIG. 1, an exemplary network graph expressed as nodes and edges is presented to illustrate important concepts of the invention. It is noted that the network graph shown is representative of countless network configurations that can be processed using the techniques of the invention. Thus, the network configuration shown in FIG. 1 is not intended to limit the scope of the present invention.

The network configuration of FIG. 1 includes three nodes and two edges. Node A is connected to Node C via Edge X, and Node B is connected to Node C through Edge Y. Each node represents a simulation model of a network entity capable of performing a particular task, phenomenon, or computation. Furthermore, each node is capable of presenting its results to a compatible edge. Each edge represents a simulation model of a network entity capable of transforming and transmitting the results from one compatible node to another compatible node.

A connection between an edge and node can only occur when the edge and node are compatible with each other. Thus, Node A is shown compatible with Edge X as its output edge or "post-edge," while Node C is shown compatible with Edges X and Y when these edges are its input edges or "pre-edges." Note that Node A may not necessarily be compatible with Edge X as its pre-edge, and Node C may not be compatible with Edges X and Y when these edges are its post-edges. Furthermore, a particular node type may be compatible with more than one edge type, and an edge type may be compatible with more than one node type.

As discussed in detail below, the present invention provides a system for configuring network models such that efficient yet flexible simulations can be achieved. The present invention beneficially allows one-time design and implementation of the simulation infrastructure. In addition, the present invention allows implementation of executable models that correspond to entities or phenomena of interest. Furthermore, the present invention allows executable models to interact with each other via compiled interfaces for fast run-time performance and satisfaction of configuration constraints enforceable through compile-time type checking. The present invention also allows the addition of new executable models and modes of model interaction without recoding the simulation infrastructure.

In accordance with one embodiment of the invention, establishing connections between edges and nodes is achieved using edge and node factories for the various types of edges and nodes in the network. For example, if a node of type "A" is desired in the network simulation, a simulation infrastructure requests a node from a node factory whose type is "A". The value "A" is referred to as a model name and can be any value, such as a string or a number. The node instance of type "A" returned by the node factory can then be parameterized by the simulation infrastructure. The precise parameterization of an edge or node consists of name-value pairs and can be specified in the network specification. For example, if a node of type "A" requires an initial value for its voltage, this value can be specified as "voltage=1.0" in the network specification. In addition, relationships between nodes and edges can be parameterized similarly using an attribute parameter set. For example, the effect of an edge on a node may be determined by a constant weight that is neither a property of the edge nor the node, but instead is a function of the edge-node pair, or of a specific interaction intended by the user. For example, a node of type "A" may receive multiple inputs from edges of type "X", however a user may intend that subsets of these inputs be assigned different gain factors depending on their origin in the network. In this case, a parameter value (e.g., "input=driving") can provide the edge's origin in the network, which is required to parameterize this relationship and assign the input a gain factor of say 2 in the node computation. For another instance of edge of type "X" that provides an input to the same node, a different parameter value (e.g., "input=feedback") can result in a gain factor of 1 in the node computation.

Once edges are obtained from edge factories and nodes are obtained from node factories, they can be configured appropriately. This is achieved by a query and discovery process. For example, suppose Node A is required to connect with Node C using an Edge X. Since Edge X knows what types of inputs it requires, it queries Node A to find out if these inputs are supported. In a particular embodiment of the invention, the Run Time Type Identification (RTTI) capability of C++, which provides a dynamic cast operator, is utilized to discover inputs and outputs supported by nodes and edges. If Node A does not produce the interface required by Edge X, the dynamic cast operation fails and an error is reported.

Once Edge X verifies that Node A provides the inputs desired, it obtains references to those inputs. Edge X can now use the input references in its own computations. Node A then adds Edge X as its post-edge, and Edge X adds Node C as its post-node. Next, Node C adds Edge X as its pre-edge using the same query and discovery process described. The result is that Node C obtains references to the variables in Edge X that are used in computations performed by Node C.

If Edge X had to be connected to a different node as its pre-node, say Node E, then Edge X will query Node E about its outputs. The new query is performed to ensure that Node E is compatible with Edge X as its pre-node, since Node E may provide different outputs than Node A. Such accounting for differences in the behavior of nodes and edges takes place automatically without user intervention. More importantly, the user is not required to rewrite simulation code every time a configuration change is introduced to the simulation system.

Figure 2:
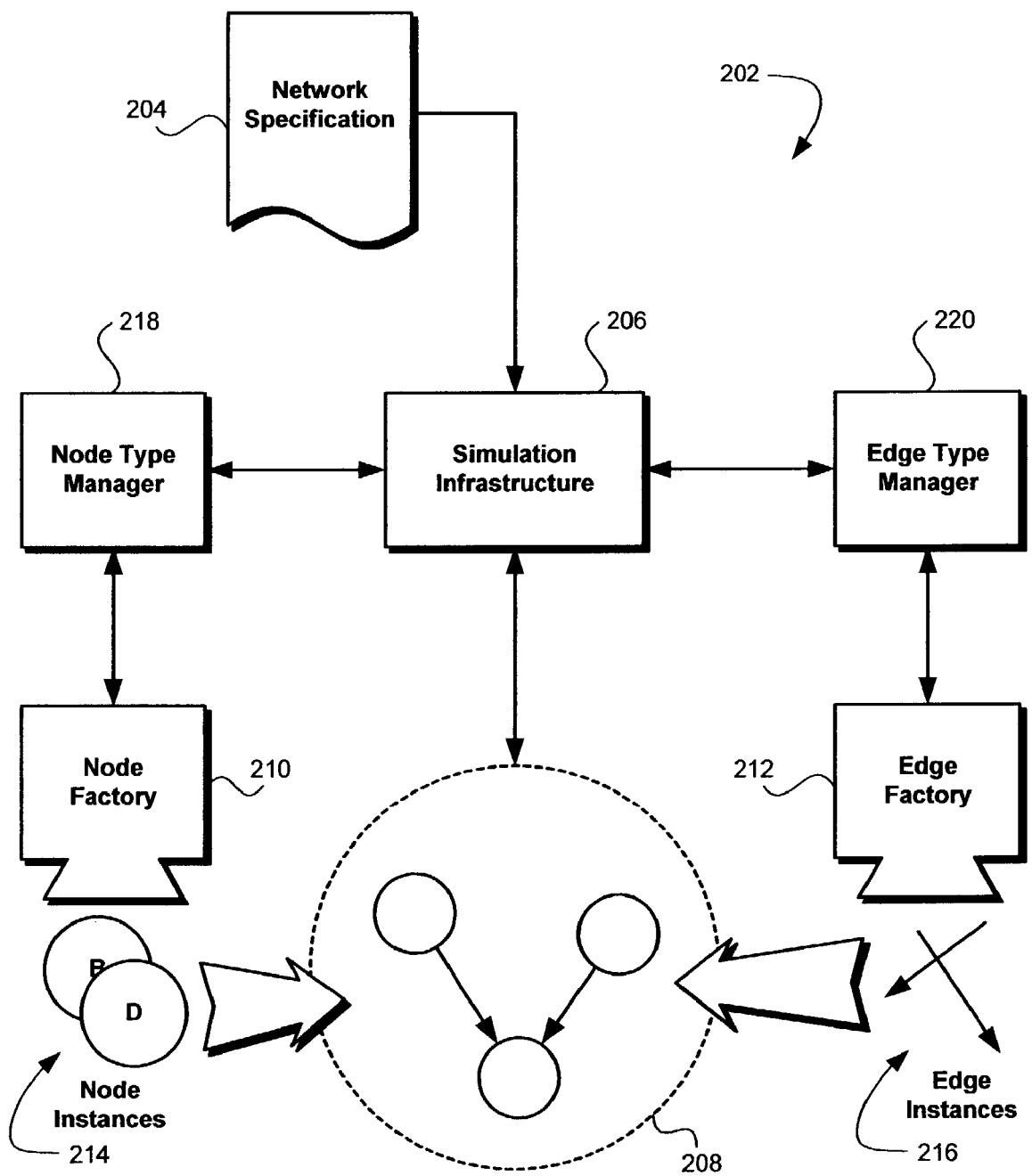
FIG. 2 shows an exemplary system contemplated by the present invention.

Turning now to FIG. 2, an exemplary system 202 contemplated by the present invention is shown. The system includes a specification document 204 configured to describe relationships between network models, such as nodes and edges, in a network abstraction 208. The specification document 204 may be embodied as an independent file, or incorporated in a simulation system employing the present invention. The specification document 204 is coupled to a simulation infrastructure 206.

The simulation infrastructure 206 is adapted to configure network models specified in the specification document 204. The simulation infrastructure can possess a fixed configuration, a means to compute the configuration, or some other means to acquire the configuration. The act of configuring, in this case, refers to establishing relationships among network models. Related components may pass data or processing control to each other to support the underlying model implementations and desired system behavior. The overall set of components and their relationships constitutes a particular configuration.

For every configuration, the components must be interoperable with all components with which they have a relationship. Thus, there are inherently configuration constraints. Some of these constraints apply across all configurations supported by the network abstraction 208. To limit the implementation requirements of modeling components, the simulation infrastructure 206 enforces configuration constraints in the configuration infrastructure of the network abstraction 208, rather than in the components themselves. For example, it may be desirable for a network model to impose the constraint that edges may only be connected to two nodes and that nodes may be connected to an arbitrary number of edges. Thus, the simulation infrastructure 206 enforces this constraint rather than each node or edge model enforcing the constraint. Other constraints are particular to modeling-specific APIs and are enforced by the network models themselves to ensure full interoperability among components.

Using the description of network models from the specification document 204, the simulation infrastructure 206 accesses corresponding model factories 210 and 212 to generate instances of network models 214 and 216. Once produced, model instances 214 and 216 are added to the network abstraction 208 for simulation. It is contemplated that the model factories 210 and 212 can be either statically linked or dynamically loaded whenever a request for a particular network model is made.

In one embodiment of the invention, node factories 210 are used to generate node instances 214 and edge factories 212 are used to generate edge instances 216. When the simulation infrastructure 206 requires a node instance 214 to be generated, a node type manager 218 is called. The node type manager 218 determines which node type is required and either returns the corresponding node factory 210 from its registry or, if it is not found, dynamically loads the node factory 210 and returns its reference. Similarly, when the simulation infrastructure 206 requires an edge instance 216 to be generated, an edge type manager 220 is called. The edge type manager 220 determines which edge type is required and either returns the corresponding edge factory 212 from its registry or, if it is not found, dynamically loads the edge factory 212 and returns its reference.

Figure 3:
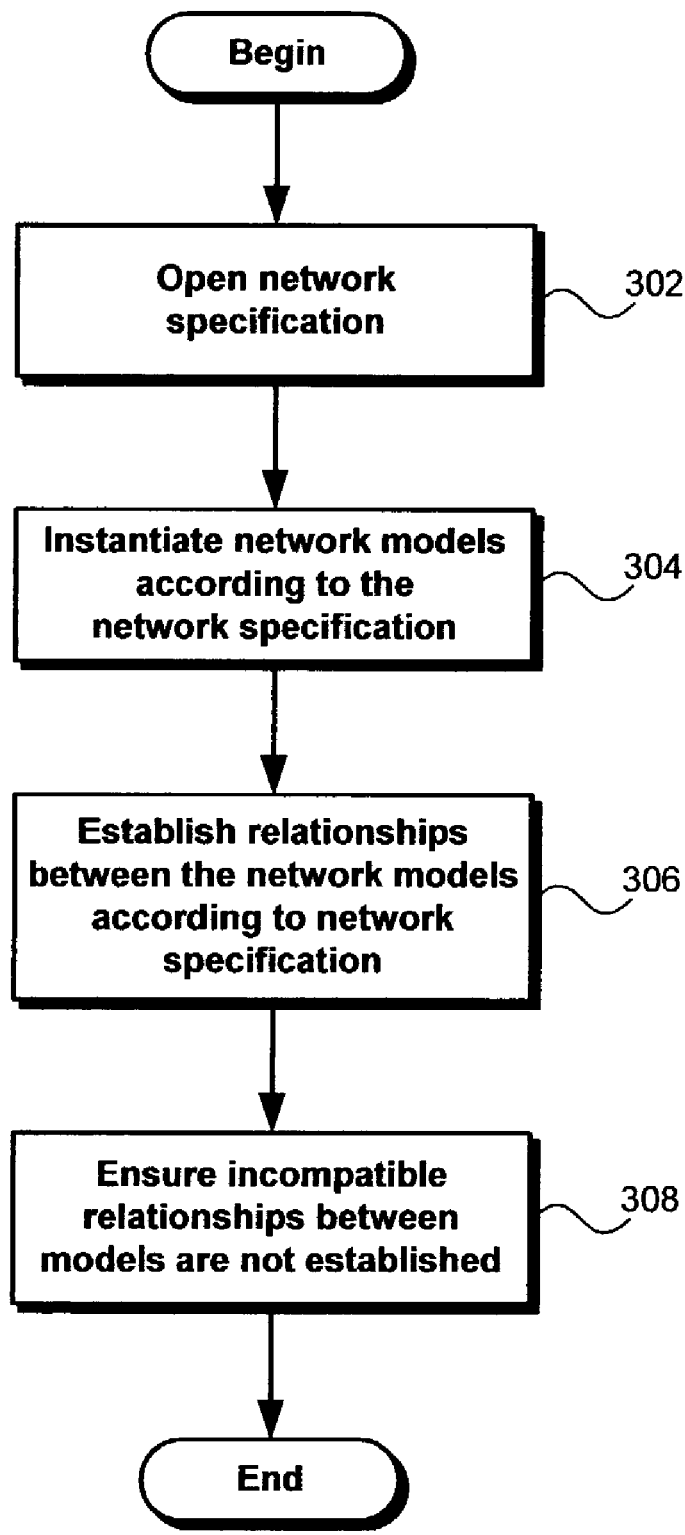
FIG. 3 shows a flowchart of operations performed by one embodiment of the present invention.

In FIG. 3, a flowchart of operations performed by one embodiment of the present invention is shown. It should be remarked that the logical operations of the invention may be implemented (1) as a sequence of computer executed steps running on a computing system and/or (2) as interconnected machine modules within the computing system. The implementation is a matter of choice dependent on the performance requirements of the system implementing the invention. Accordingly, the logical operations making up the embodiments of the present invention described herein are referred to alternatively as operations, steps, or modules.

Operation flow begins with accessing operation 302, wherein the system infrastructure opens the specification document. The specification document is formatted to describe network models, model parameters, and relationships between the models in the network abstraction. For example, the specification document may include specifications of nodes and edges, their specific types, the connections between nodes and edges, and the parameterization specification of these connections. Thus, the accessing operation 302 includes various run-time means for the simulation infrastructure to compute or acquire a desired simulation configuration.

It is possible to connect a given node to different types of edges at initialization. If a different type of connectivity is desired, one simply changes the specification document. For example, one can preserve the same network topology, but use different edge and node types. For this kind of change, no rewriting of the edge and node types is required. Likewise, the same simulation code can accommodate modifying the nodes and edges while preserving the network topology using the methods of the present invention. After accessing the specification document, control passes to instantiating operation 304.

At instantiating operation 304, network models are instantiated according to the specification document. Ideally, a model will be implemented only once, however, a simulation may contain multiple instances (components) of a model implementation. As described above, instantiating models includes passing network model types enumerated in the specification document to model managers. The network managers, in turn, call model factories to instantiate the network models. Once instantiating operation 304 is completed, control passes to establishing operation 306.

At establishing operation 306, network models establish relationships with other network models in accordance with the specification document. The simulation infrastructure includes a run-time means to access the configuration, relationship parameterization, and execution APIs of component instances. After the establishing operation 306 is completed, control passes to ensuring operation 308.

At ensuring operation 308, the network models ensure that incompatible relationships are not established with other network models. During this operation, the network models query other model instances with which they are specified to interact to determine if they are compatible. Thus, the network models include a run-time means for acquiring access to modeling-specific APIs of other network model instances. As mentioned, the invention may employ dynamic type-casting to determine if a particular model interface is supported. Once the ensuring operation 308 is completed, the network abstraction is configured and simulation can begin.

Figure 4:
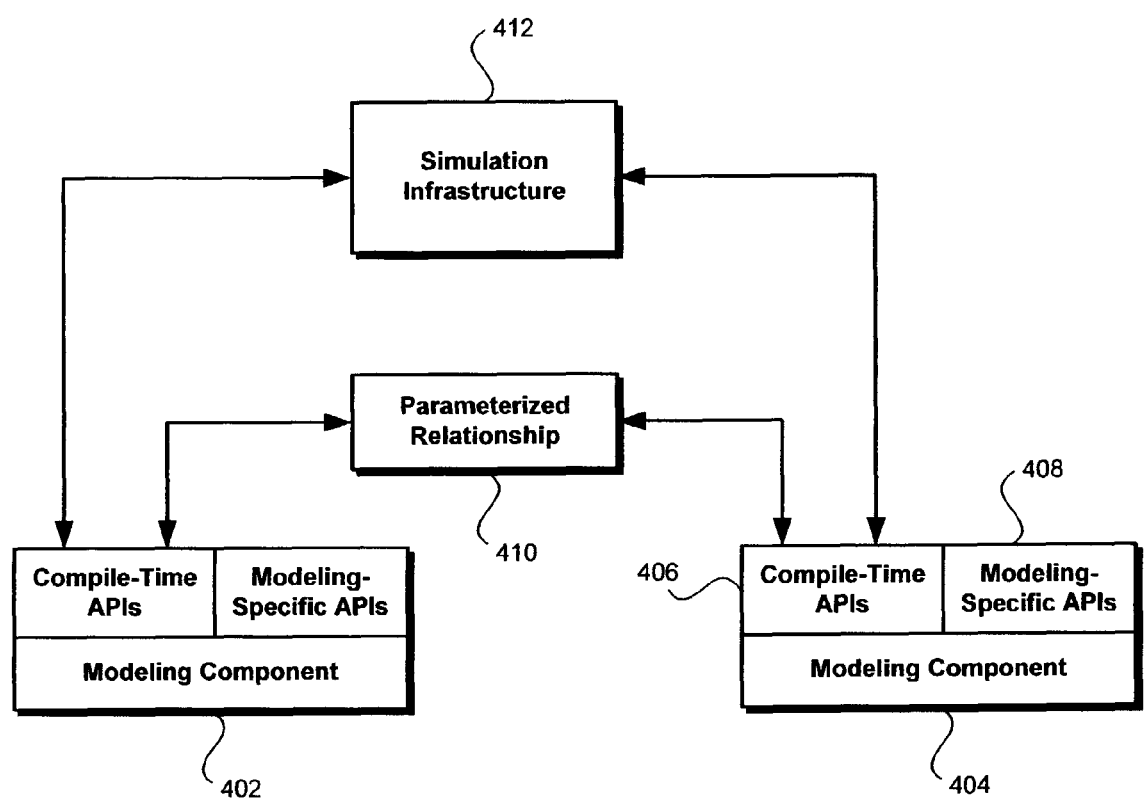
FIG. 4 shows exemplary modeling components contemplated by one embodiment of the present invention.

In FIG. 4, modeling components 402 and 404 contemplated by one embodiment of the present invention are shown in detail. Each modeling component 402 and 404 supports standard, compile-time APIs 406 for configuration, relationship parameterization, and execution. Relationship parameterization refers to providing information that is specific to the relationship, as opposed to the participants in the relationship. Modeling components 402 and 404 may optionally support an arbitrary number of additional modeling-specific APIs 408 for interactions that are available at the time of compilation. The implementation of a modeling component must be able to properly use any modeling-specific APIs that it requires and that will be implemented by other components with which it has a relationship 410.

When a relationship 410 with another component is established via the compile-time APIs 406, each modeling component 402 and 404 accesses the necessary modeling-specific APIs 408. References to any APIs accessed may be stored locally to avoid having to acquire them more than once. If the required APIs are not available on a particular component, then the modeling component executes an error handling routine.

The simulation infrastructure 412 is further capable of accessing the instances of modeling components 402 and 404 required for the configuration and manipulation of these components using standardized APIs 406. These APIs 406 may represent different categories of components (e.g., edges and nodes) for the enforcement of broadly applicable configuration constraints, such as edge-node constraint described in the previous section. The simulation infrastructure 412 is also able to parameterize the relationships 410 via the APIs 406. It is assumed that a means exists to execute the modeling components via standardized APIs. This capability, however, is beyond the scope of the present invention.

Satisfying the above requirements of modeling components and the simulation infrastructure has many beneficial implications. First, the modeling components are independent of the simulation infrastructure. Therefore, the simulation infrastructure can be modified without affecting previously implemented components. Second, the components are only dependent on the modeling-specific APIs, not the specific types of components implementing them. Thus, newly added components can be interoperable with previously implemented components without modification of the simulation infrastructure or of previously implemented components. Third, new modeling-specific APIs and components can be added without affecting the usefulness of interoperability of older components. Thus, components and modeling specific interfaces can be added without breaking the interoperability of previously implemented components. Finally, since component-to-component interaction is realized through compiled APIs, high run-time performance is achieved. In other words, the only run-time cost to the flexibility and extensibility of the system is the one-time cost of gaining access to the desired modeling-specific APIs.

One embodiment of the present invention is an object-oriented C++ implementation of an edge-node graph simulator. The system API defines two interfaces (pure abstract classes) for components: the first specific to nodes, and the second to edges. Each node component is derived from the "node" interface, and likewise each edge component is derived from the "edge" interface. The node interface provides methods for initialization, execution, and for connecting to and from nodes. In both interfaces, the methods for connecting include arguments for the parameterization of the relationships between nodes and edges. Thus, these interfaces enforce the edge-node graph constraints described above.

Models of nodes and edges implement the node and edge interfaces, as well as zero or more modeling-specific interfaces. The configuration methods of the node interface take references to edges as arguments. The implementation of these methods for each specific node component uses the dynamic type-casting capabilities of C++ as the run-time means to access the desired modeling-specific interfaces from the provided edge references. Similarly, the configuration methods of the edge interface take references to nodes as arguments, and the implementation of these methods also use dynamic type-casting as the run-time means to gain access to the modeling-specific node interfaces.

Figure 5:
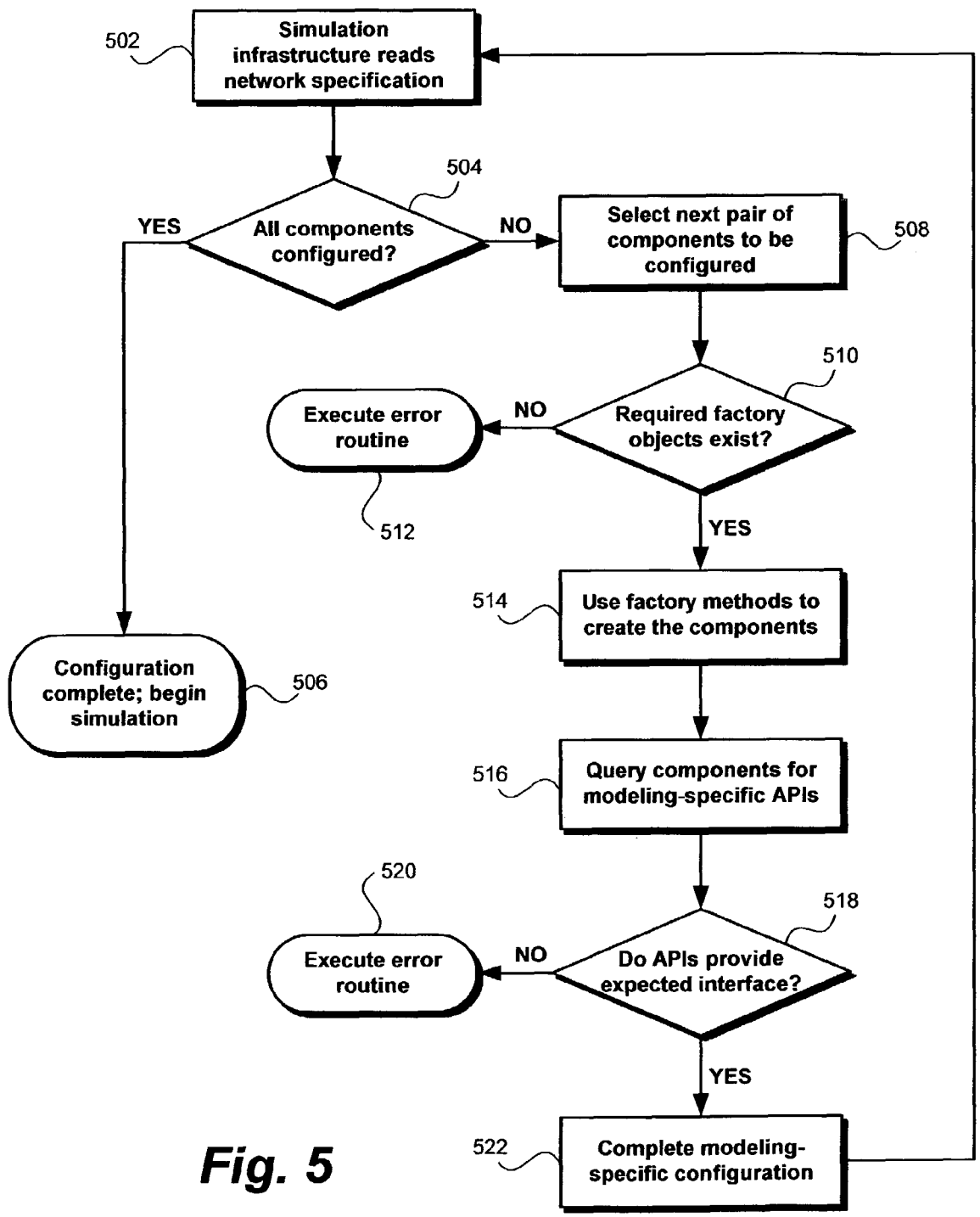
FIG. 5 shows flowchart of operations performed by another embodiment of the present invention.

In FIG. 5, a flow chart of operations performed by a configuration system contemplated by the present invention is shown. Control flow begins at reading operation 502. During this operation, the simulation infrastructure uses a specification document to access configuration information. As mentioned earlier, the specification document includes specification of nodes and edges and their specific types, the connections between nodes and edges, and the parameterization specification of these connections. After the specification document is read, control passes to decision operation 504.

At decision operation 504, the simulation infrastructure checks whether all the simulation components have been configured. If all the components have been configured, control passes to simulating operation 506, where the system is ready to simulate the network abstraction detailed in the specification document. If more components need to be configured, control passes from decision operation 504 to selecting operation 508.

At selecting operation 508, the system infrastructure selects a pair of components that need to be configured. Once the components are selected, the simulation infrastructure attempts to gain access to the appropriate factory objects via the appropriate type manager (node type manager or edge type manager) at decision operation 510. If the simulation infrastructure is unsuccessful and the required factory objects do not exist, control passes to error operation 512. Error operation 512 stops the configuration process and informs the user that the appropriate factory objects do not exist. If, however, the appropriate factory object is returned, control passes from query operation 510 to using operation 514.

At using operation 514, the simulation infrastructure invokes the appropriate factory methods to create instances of the selected components. Next, at query operation 516, the components gain access to other components via their modeling-specific APIs. This operation can be viewed as a discovery phase, where one component discovers, through the process of dynamic type-casting, the modeling-specific interfaces that the related component supports. It is contemplated that the discovery phase may be performed only once; at the time the relationship is established. If, at decision operation 518, the requested modeling-specific APIs are found not to exist, an error routine is executed at error operation 520. Upon successful completion of this pair of components control passes to completing operation 522 and the procedure is repeated until all components have been configured.

One operating environment in which the present invention is potentially useful encompasses the general-purpose computer. Examples of such computers include SPARC(r) systems offered by Sun Microsystems, Inc. and Pentium(r) based computers available from International Business Machines Corp. and various other computer manufacturers. SPARC is a registered trademark of Sun Microsystems, Inc. and Pentium is a registered trademark of Intel Corporation.

Figure 6:
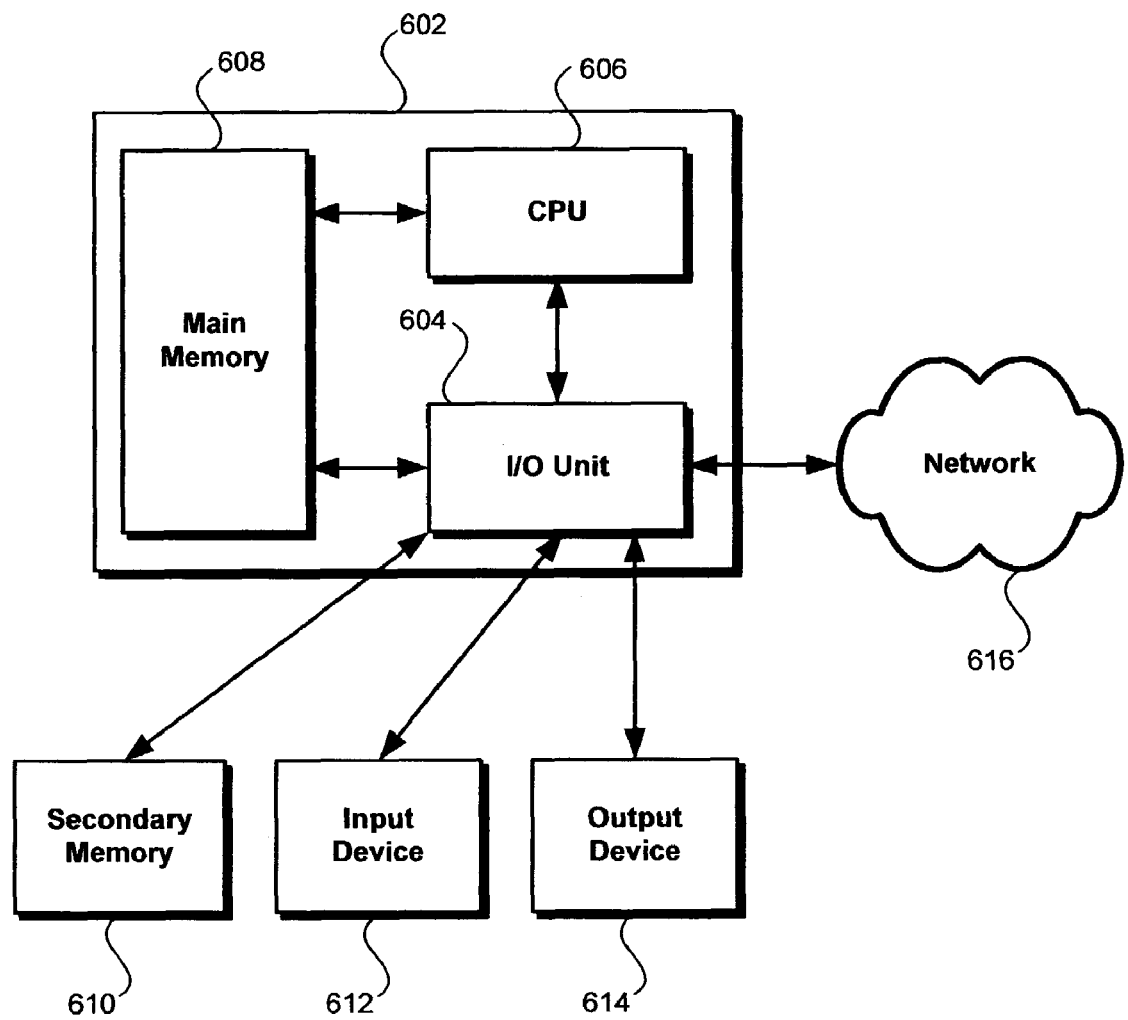
FIG. 6 shows an exemplary computing environment in which the present invention may be implemented.

Some of the elements of a general-purpose computer are presented in FIG. 6, wherein a processor 602 is shown having an input/output (I/O) unit 604, a central processing unit (CPU) 606, and a main memory unit 608. The main memory unit 608 generally stores program instructions and data used by the processor 602. Instructions and instruction sequences implementing the present invention may, for example, be embodied in memory 608. Various types of memory technologies may be utilized in the main memory unit 608, such as Random Access Memory (RAM), Read Only Memory (ROM), and Flash memory.

The I/O unit 604 connects with a secondary memory unit 610, an input device unit 612, and an output device unit 614. The secondary memory unit 610 represents one or more mass storage devices, such as hard disks, floppy disks, optical disks, and tape drives. Secondary memory 610 is typically slower than main memory 608, but can store more information for the same price. The input device unit 612 may include input hardware such as a keyboard or mouse. The output device unit 614 typically includes devices such as a display adapter, a monitor and a printer. The I/O unit 604 may further be connected to a computer network 616.

Arrows in FIG. 6 represent the system bus architecture of the computer, however, these arrows are for illustrative purposes only. It is contemplated that other interconnection schemes serving to link the system components may be used in the present invention. For example, a local video bus could be utilized to connect the CPU 606 to an output device 614, even though a direct arrow between the CPU 606 and the output device 614 is not shown.

The foregoing description of the invention has been presented for purposes of illustration and description. It is not intended to be exhaustive or to limit the invention to the precise form disclosed, and other modifications and variations may be possible in light of the above teachings. The embodiments disclosed were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

The invention claimed is:

1. A computer implemented method for configuring a network abstraction for simulation, the method comprising:
    accessing a network specification, the network specification describes relationships between nodes and node edges in the network abstraction, the nodes including node configuration restraints and the edges including edge configuration restraints;
    instantiating network models in accordance with the network specification using node factories to generate node instances and edge factories to generate edge instances;
    establishing relationships between the node instances and generate edge instances in accordance with the network specification such that the node configuration restraints and the edge configuration restraints are enforced; and
    ensuring that incompatible relationships violating the node configuration restraints and the edge configuration restraints are not established between the network models; and
    wherein ensuring that incompatible relationships are not established between the network models further comprises requiring that network models query the network models they are specified to interact with to determine if they support necessary interfaces.

2. The method of claim 1, wherein instantiating network models further comprises invoking appropriate factory objects to create instances of the network models.

3. The method of claim 2, further comprising gaining access to the appropriate factory objects through an appropriate type manager.

4. The method of claim 1, further comprising providing access to the network models through configuration APIs.

5. The method of claim 4, further comprising enabling network models to access the configuration APIs of network models that they are specified to interact with.

6. The method of claim 5, further comprising using dynamic type-casting to gain access to desired modeling-specific APIs via the configuration APIs.

7. The method of claim 5, further comprising discovering, through the process of dynamic type-casting, modeling-specific interfaces that related network models support.

8. The method of claim 4, further comprising using parameterization of network models according to the network specification and the configuration APIs.

9. The method of claim 8, further comprising using dynamic type-casting to gain access to desired modeling specific APIs via the configuration APIs.

10. The method of claim 8, further comprising discovering, through the process of dynamic type-casting, the modeling specific interfaces that related network models support.

11. The method of claim 4, further comprising using parameterization of relationships between network models according to the network specification and the configuration APIs.

12. The method of claim 11, further comprising using dynamic type-casting to gain access to desired modeling specific APIs via the configuration APIs.

13. The method of claim 11, further comprising discovering, through the process of dynamic type-casting, the modeling specific interfaces that the related network models support.

14. The method of claim 1, further comprising querying by the network models other network models they are specified to interact with to determine if they support necessary interfaces.

15. The method of claim 1, wherein establishing relationships between the network models is performed only once at the time the relationship is established.

16. A computer program product embodied in a tangible media comprising:
    computer readable program codes coupled to the tangible media for configuring a network abstraction for simulation, the computer readable program codes configured to cause the program to:
    access a network specification, the network specification describes relationships between nodes and node edges in the network abstraction, the nodes including node configuration restraints and the edges including edge configuration restraints;

instantiate network models in accordance with the network specification using node factories to generate node instances and edge factories to generate edge instances;

establish relationships between the node instances and generate edge instances in accordance with the network specification such that the node configuration restraints and the edge configuration restraints are enforced; and ensure that incompatible relationships violating the node configuration restraints and the edge configuration restraints are not established between the network models; and wherein the computer code to ensure that incompatible relationships are not established between the network models further comprises computer code to require that network models query the network models they are specified to interact with to determine if they support necessary interfaces.

17. The computer program product of claim 16, wherein the computer code to instantiate network models further comprises computer code to invoke appropriate factory objects to create instances of the network models.

18. The computer program product of claim 17, further comprising computer code to gain access to the appropriate factory objects through an appropriate type manager.

19. The computer program product of claim 16, further comprising computer code to provide access to the network models through configuration APIs.

20. The computer program product of claim 19, further comprising computer code to enable network models to access the configuration APIs of network models that they are specified to interact with.

21. The computer program product of claim 20, further comprising computer code to use dynamic type-casting to gain access to desired modeling-specific APIs via the configuration APIs.

22. The computer program product of claim 20, further comprising computer code to discover, through the process of dynamic type-casting, modeling-specific interfaces that related network models support.

23. The computer program product of claim 19, further comprising computer code to use parameterization of network models according to the network specification and the configuration APIs.

24. The computer program product of claim 23, further comprising computer code to use dynamic type-casting to gain access to desired modeling specific APIs via the configuration APIs.

25. The computer program product of claim 23, further comprising computer code to discover, through the process of dynamic type-casting, the modeling specific interfaces that related network models support.

26. The computer program product of claim 19, further comprising computer code to use parameterization of relationships between network models according to the network specification and the configuration APIs.

27. The computer program product of claim 26, further comprising computer code to use dynamic type-casting to gain access to desired modeling specific APIs via the configuration APIs.

28. The computer program product of claim 26, further comprising computer code to discover, through the process of dynamic type-casting, the modeling specific interfaces that the related network models support.

29. The computer program product of claim 16, further comprising computer code to query by the network models other network models they are specified to interact with to determine if they support necessary interfaces.

30. The computer program product of claim 16, wherein the computer code to establish relationships between the network models is executed only once at the time the relationship is established.

* * * * *